United States Patent [19]
Yanagi

[11] Patent Number: 5,493,473
[45] Date of Patent: Feb. 20, 1996

[54] CASE FOR SHIELDING ELECTRONIC CIRCUIT MEMBERS FROM ELECTROMAGNETIC WAVES

[75] Inventor: Nobuyuki Yanagi, Tokyo, Japan

[73] Assignee: NEC Corporation, Tokyo, Japan

[21] Appl. No.: 258,471

[22] Filed: Jun. 7, 1994

[30] Foreign Application Priority Data

Jun. 30, 1993 [JP] Japan ..................... 5-161379

[51] Int. Cl.⁶ ................................ H05K 7/20
[52] U.S. Cl. ................ 361/695; 165/80.3; 361/796; 361/818
[58] Field of Search ............... 211/41; 174/16.1, 174/35 R; 62/414, 418, 259.2; 165/80.2, 80.3, 122, 126; 361/816, 818, 796, 800, 736, 752, 724, 725, 729, 730, 690, 692–695, 714, 715, 719–721

[56] References Cited

U.S. PATENT DOCUMENTS

| | | | |
|---|---|---|---|
| 3,648,113 | 3/1972 | Rathjen | 317/100 |
| 3,956,673 | 5/1976 | Seid | 62/418 |
| 4,149,218 | 4/1979 | Carrubba | 361/383 |
| 4,797,782 | 1/1989 | Wistling | 361/384 |
| 4,821,145 | 4/1989 | Corfits et al. | 361/383 |
| 5,099,391 | 3/1992 | Maggelet | 361/395 |
| 5,206,796 | 4/1993 | Thompson | 361/424 |
| 5,231,561 | 7/1993 | Johnson | 361/818 |
| 5,243,493 | 9/1993 | Jeng | 361/690 |

FOREIGN PATENT DOCUMENTS

| | | |
|---|---|---|
| 1-143397 | 6/1989 | Japan . |
| 1-290298 | 11/1989 | Japan . |
| 4-26194 | 1/1992 | Japan . |

*Primary Examiner*—Gerald P. Tolin
*Attorney, Agent, or Firm*—Young & Thompson

[57] ABSTRACT

Cooling air compulsorily introduced from an air inflow hole 18 into a duct 10 by means of a fan 5 is compressed within the duct 10 and enters a duct 13 from an air outflow hole 11 through an air inflow hole 12 to be injected into a package 23 from an air outflow hole 14 through an air inflow hole 15. Subsequently, it flows along both surfaces of a printed circuit board 21, during which it exchanges heat with the heat evolving portion of the printed circuit board 21 to flow out from an air outflow hole 16 into the container body 1. From the interior of a container body 1, air flows out through an air outflow hole 17 to the exterior. The printed circuit board 21 can be cooled efficiently with a small air flow rate and an excellent performance of electromagnetic shielding can be achieved.

20 Claims, 12 Drawing Sheets

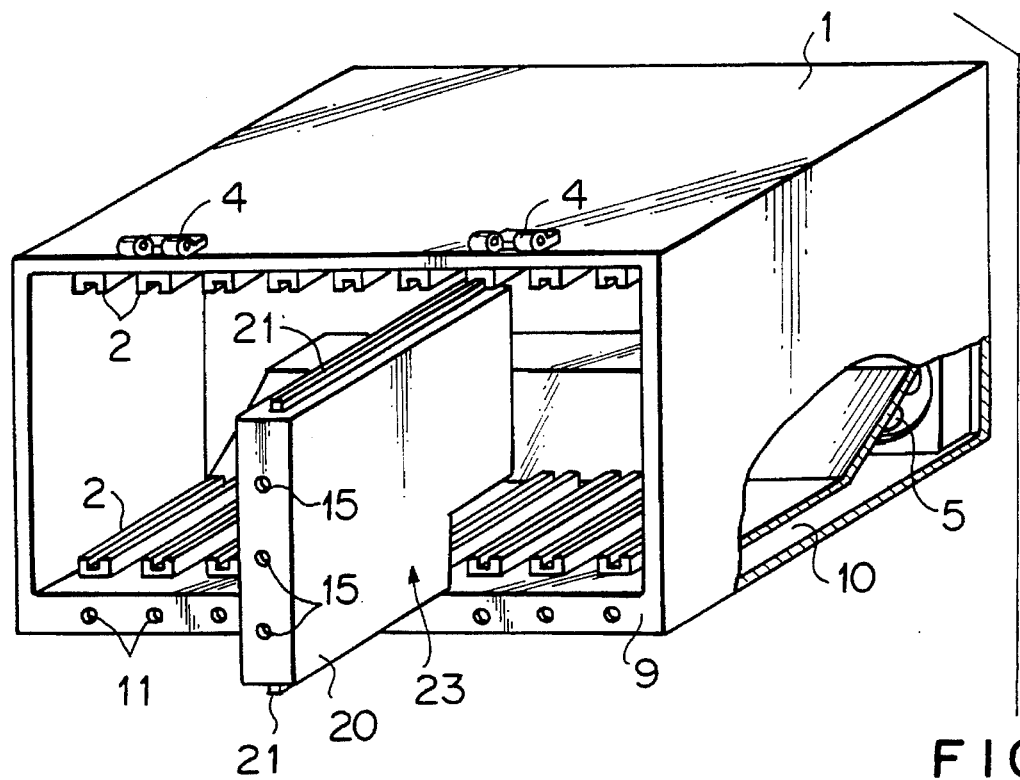
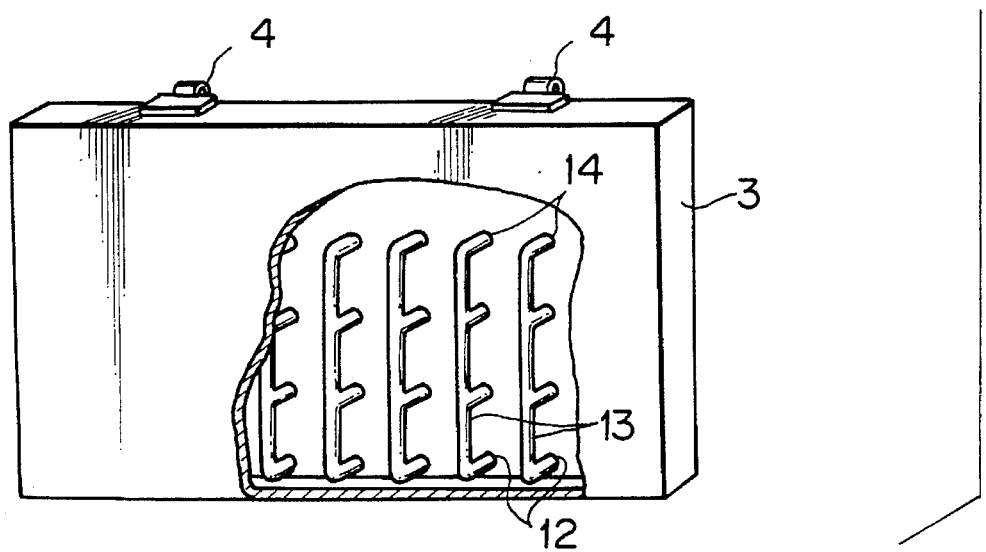
FIG.3

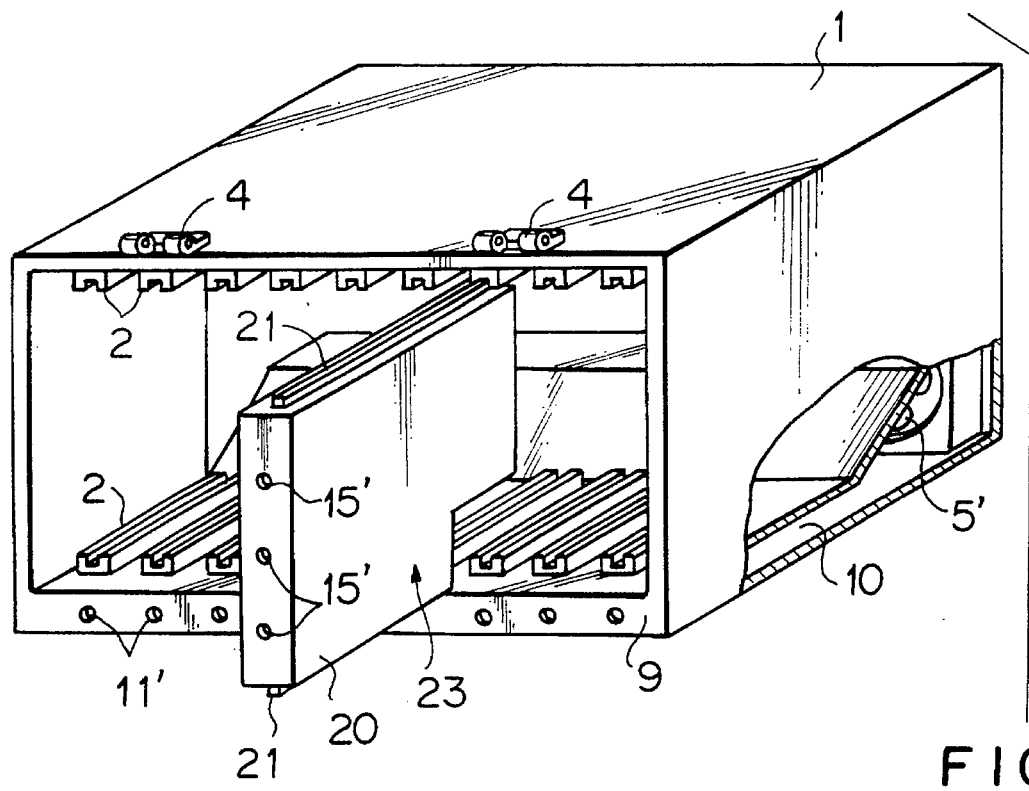
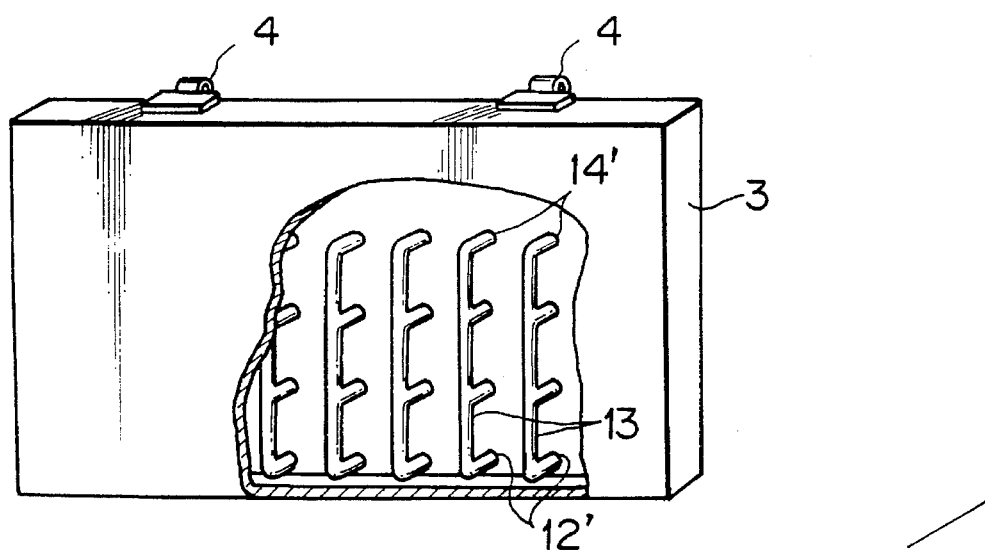
FIG.11

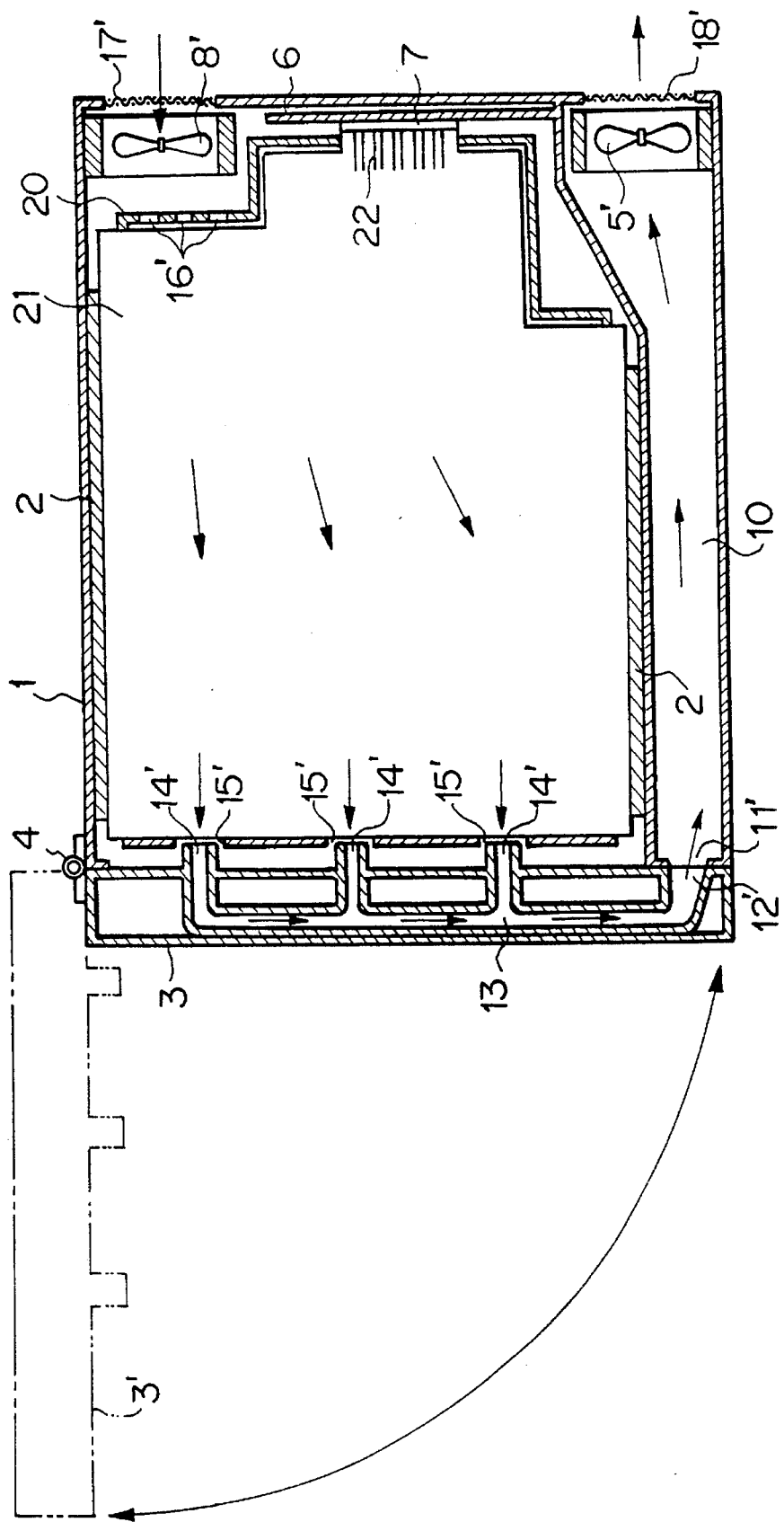

CASE FOR SHIELDING ELECTRONIC CIRCUIT MEMBERS FROM ELECTROMAGNETIC WAVES

FIELD OF THE INVENTION

The present invention relates to a case for shielding an electronic circuit member from electromagnetic waves and, specifically, to a case for shielding an electronic circuit member, such as a printed circuit board, which is used in a telecommunication equipment or the like while maintaining electrical connection and being compulsorily cooled by air.

BACKGROUND OF THE INVENTION

In recent years, in order to block electromagnetic noises from various electronic devices, an electromagnetic shield, that is, means to block them from entering the electronic device from the exterior and to block them from being emitted from the interior of the electronic device to the exterior have been called for. For example, conventionally, in order to block entrance and emission of the electromagnetic waves between the entire building equipped with various electronic devices and the exterior, windows of special construction have been adopted (see Japanese Patent Application Laid-Open No. 1-290298) or, container devices of special construction have been adopted in order to prevent electromagnetic waves from entering and being emitted from the electronic circuit member (see Japanese Patent Application Laid-Open No. 1-143397).

On the other hand, the improvement of the semiconductor technology has entailed miniaturization of the electronic circuit thus realizing the miniaturizing many electronic devices. Thus, as the power consumption is increased, local heat evolution of the electronic circuit member has been increased, which has forced us to adopt a compulsory air cooling system in place of the natural air cooling system (see Japanese Patent Application Laid-Open No. 4-26194).

Therefore, an excellent air cooling function is also expected of the case for shielding the electronic circuit member from the electromagnetic noises. In order to achieve a sufficient shielding effect, in certain cases, the electronic circuit member may be sealed with a case made of electrically conductive material to compulsorily cool the case from the exterior by air, which cannot, however, assure a sufficient cooling effect. Therefore, in some cases, holes for circulating the cooling air are provided through the electrically conductive case. A punched metal plate or metallic network may be attached to the holes in order to prevent reduction of the shielding effect. However, in order to assure the excellent shielding performance, as the frequency of the relevant electromagnetic waves becomes high, it is necessary to reduce the size of the air circulating hole, in which case, however, with the conventional construction, it is necessary to increase the amount of circulating air in order to achieve a sufficient cooling effect. However, if the air flow rate is increased, then the noise caused by the fan or the like, which is the source of supplying air, is undesirably increased.

SUMMARY OF THE INVENTION

The present invention was made in order to solve the forgoing conventional problems, and its object is to provide a case for shielding electronic circuit members from electromagnetic waves in which an excellent shielding effect can be achieved and in which an excellent heat dissipating effect can be achieved with a low flow rate of cooling air.

Another object of the present invention is to provide a case for electromagnetic shielding which allows noise to be made smaller.

A further object of the present invention is to provide a case for electromagnetic shielding which allows the electronic circuit members to be accommodated in position while allowing electrical connection to the electronic circuit members.

Still further object of the present invention is to provide a case for electromagnetic shielding which is particularly suitable for accommodating a plurality of electronic circuit members.

A case for shielding an electronic circuit member from electromagnetic waves according to the present invention comprises at least one electronic circuit package accommodating an electronic circuit member within an electrically conductive case, and a container body having an aperture for letting in or out the electronic circuit package therethrough and a space for accommodating the electronic circuit package, and a lid body adapted to fit to the aperture of the container body.

The foregoing electronic circuit package has a connector portion carrying terminals of the electronic circuit member, and the container body has a receptacle connected to the connector portion of the electronic circuit package which is accommodated within the space;

The container body forms therein a first air inflow hole communicating with the exterior, a first air outflow hole formed at a portion abutting on the lid body adapted to fit to the container body and a first duct for communicating the first air inflow hole and the first air outflow hole.

The lid body forms therein a second air inflow hole disposed at a portion corresponding to the first air outflow hole of the container body adapted to fit to the lid body, a second air outflow hole formed at a portion opposed to the electronic circuit package which is accommodated within the container body and a second duct for communicating the second air inflow hole and the second air outflow hole.

The case of the electronic circuit package is formed with a third air inflow hole at a position corresponding to the second air outflow hole of the lid body which is adapted to fit to the container body and a third air outflow hole.

Further, the container body is formed with a fourth air outflow hole communicating with the exterior.

According to the present invention, there is provided a case for shielding electronic circuit members from electromagnetic waves, comprising:

at least one electronic circuit package accommodating an electronic circuit member within an electrically conductive case;

a container body having an aperture for letting in and out the at least one electronic circuit package therethrough and a space for accommodating the electronic circuit package; and a lid body adapted to fit to the aperture of the container body;

the electronic circuit package having a connector portion carrying terminals of the electronic circuit member, the container body having a receptacle connected to the connector portion of the electronic circuit package which is accommodated within the space;

the container body forming therethrough a first air outflow hole communicating with the exterior, a first air inflow hole formed at a portion abutting on the lid body fitted to the container body and a first duct for communicating the first air outflow hole and the first air inflow hole;

the lid body forming therethrough a second air outflow hole disposed at a position corresponding to the first air outflow hole of the container body fitted to the lid body, a second air inflow hole formed at a portion opposed to the electronic circuit package which is accommodated within the space of the container body and a second duct for communicating the second air outflow hole and the second air inflow hole;

the case of the electronic circuit package forming therethrough a third air outflow hole disposed at a portion corresponding to the second air inflow hole of the lid body fitted to the container body and a third air inflow hole; and further the container body forming therethrough a fourth air inflow hole communicating with the exterior.

According to the present invention, there is also provided a case for shielding electronic circuit members from electromagnetic waves, comprising:

(a) a container body;

(b) an electrically conductive case adapted to the electronic circuit member, the electrically conductive case being disposed within the container body and having a connector portion for connecting to an electrical connecting portion provided at the container body;

(c) at least one cooling air hole formed at the front portion of the electrically conductive case;

(d) a front cover supported at the front portion of the container body;

(e) a cooling air hole formed at an internal surface of the front cover to communicate with the cooling air hole of the electrically conductive case;

(f) a duct formed within the front cover so as to communicate with the cooling air hole thereof;

(g) a cooling air hole formed through the container body so as to communicate with the duct of the front cover;

(h) a duct formed within the container body so as to communicate with the cooling air hole thereof.

According to the case of the present invention, since the air outflow hole of the lid body and the air inflow hole of the electrically conductive case of the electronic circuit package are made close to supply the cooling air directly to a region in the immediate neighborhood of the electronic circuit member, even if the air inflow hole of the electrically conductive case of the electronic circuit package is small, the cooling function can be sufficiently increased thus allowing both the excellent electromagnetic shielding and heat dissipating effects to be achieved.

Further, according to the present invention, since the excellent heat dissipating effect can be achieved even with a small flow rate of cooling air, the noise resulting from the driving source for communicating air can be made small.

BRIEF DESCRIPTION OF THE DRAWINGS

FIG. 3 is a partially cutaway and exploded perspective view of the case of FIG. 1;

FIG. 11 is a partially cutaway and exploded perspective view of the case of FIG. 9;

FIG. 16 is a longitudinal cross-sectional view of yet another embodiment of the case according to the present invention.

DETAILED DESCRIPTION OF THE PREFERRED EMBODIMENTS

Several specific embodiments of the present invention are hereinafter described with reference to the accompanying drawings.

Figure 4:
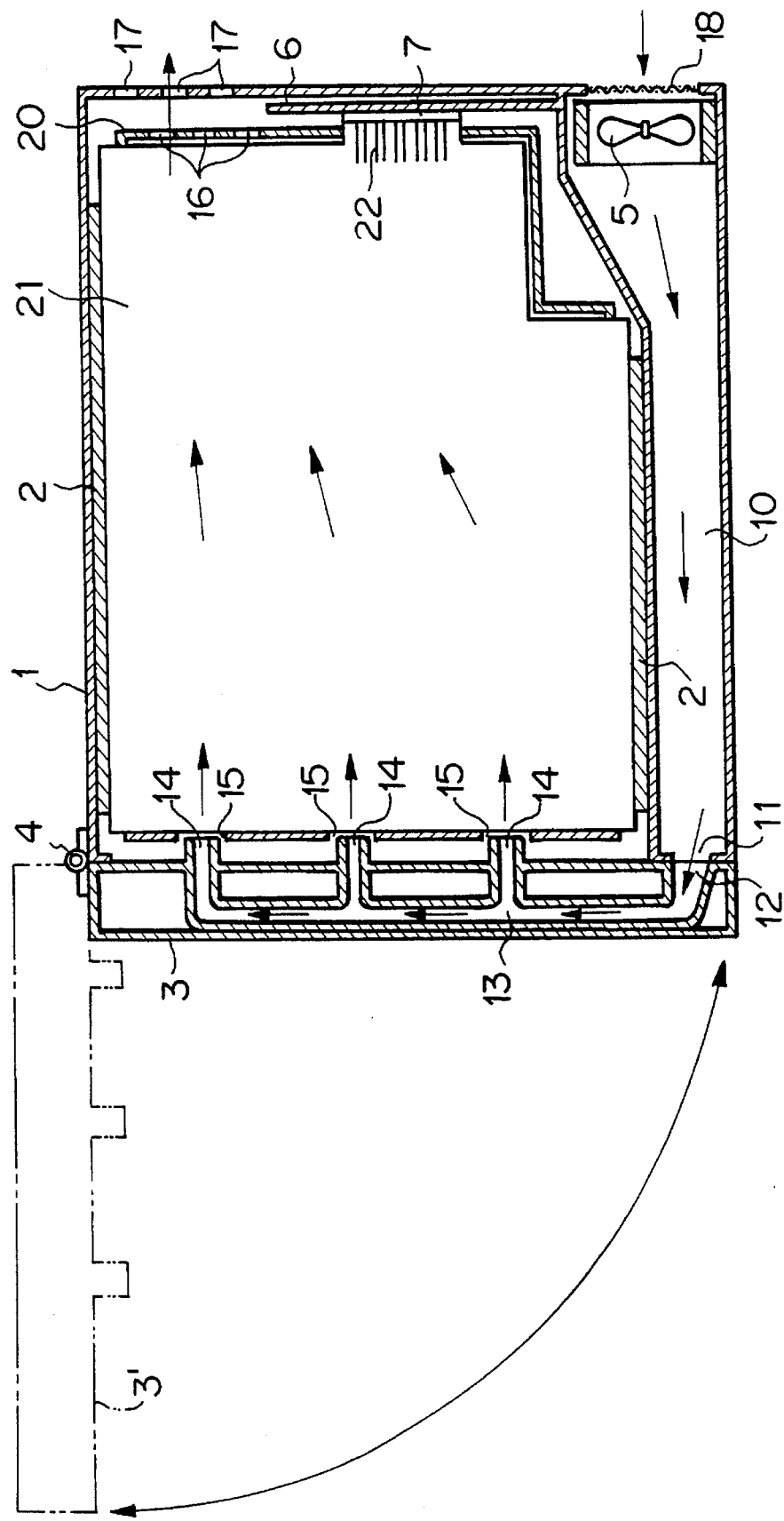
FIG. 4 is a longitudinal cross-sectional view of the case of FIG. 1.
Figure 5:
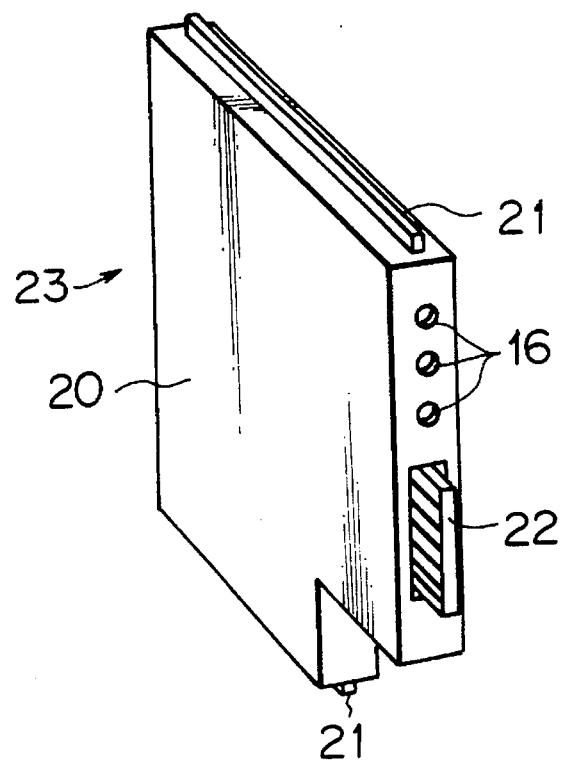
FIG. 5 is a rear-side perspective view of an electronic circuit package as viewed askance from above.

A first embodiment of the present invention is shown in FIGS. 1 through 6, in which 1 denotes a container body (body case), the body having a space therein and an aperture in front. 9 denotes the end surface of the aperture. 3 denotes a lid body (front cover) adapted to fit to the aperture of the container body 1. The lid body 3 is open—and closably attached to the container body 1 by means of a hinge 4. In FIG. 4, the lid body 3 is shown as closed by solid line, and its open position is shown by imaginary line 3'.

FIG. 3 illustrates a condition in which the hinge 4 is disassembled and the lid body 3 is removed from the container body 1. As shown in FIG. 3, internally of the container body, a plurality of guide rails 2 are formed on the bottom and top surfaces each extending in the forward and backward directions. An electronic circuit package 23 is moved in the forward and backward directions guided by a pair of corresponding guide rails disposed on the bottom and top surfaces so that it may be let in and out to and from the internal space of the container body 1 through the aperture. Guide rails 2 also have a function of retaining the electronic circuit package 23 within the container body 1. Although, in FIG. 3, only one electronic circuit package 23 is shown, a desired number of electronic circuit packages 23 may be retained by pairs of guide rails 2.

As shown in FIGS. 3 and 4, the electronic circuit package 23 is constituted by accommodating and retaining a printed cuicuit board 21, which is the electronic circuit member, within an electrically conductive case 20 made of metal or the like, and the case 20 is made flat. The upper and lower edge portions of the printed circuit board 21 protrude from the case 20 a little, and these protruding edge portions are engaged to the interior of the guide rail. A connector portion 7 formed on the printed circuit board, where the terminals of the electronic circuit are concentrated, also protrudes from the case a little in the rearward direction.

Figure 6:
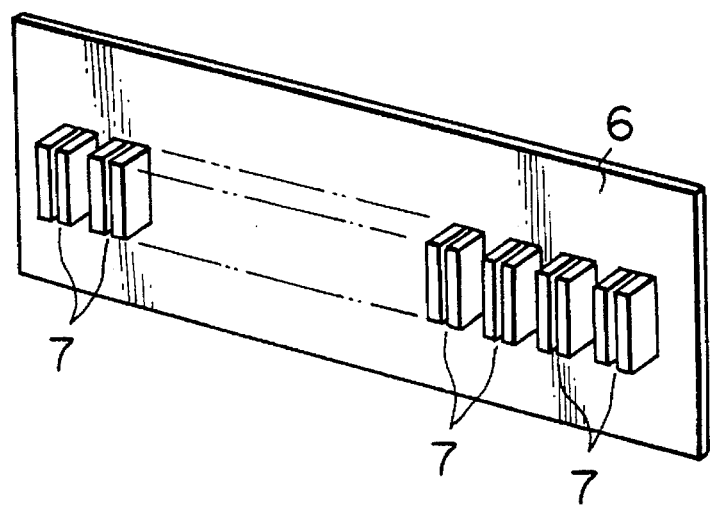
FIG. 6 is a front-side perspective view of a back plane as viewed askance from above.

As shown in FIG. 4, at the rearmost portion within the container body 1, a back plane 6 is attached so that a receptacle 7 is mounted thereto. The back plane 6 is also shown in FIG. 6. If the package 23 is made to slide in the rearward direction along the guide rails 2, then the connector portion 22 of the printed wiring board 21 of the package 23 may be forced into the receptacle 7. Thus, each printed wiring board 21 is coupled to an electronic circuit (not shown) by way of the receptacle 7.

Figure 1:
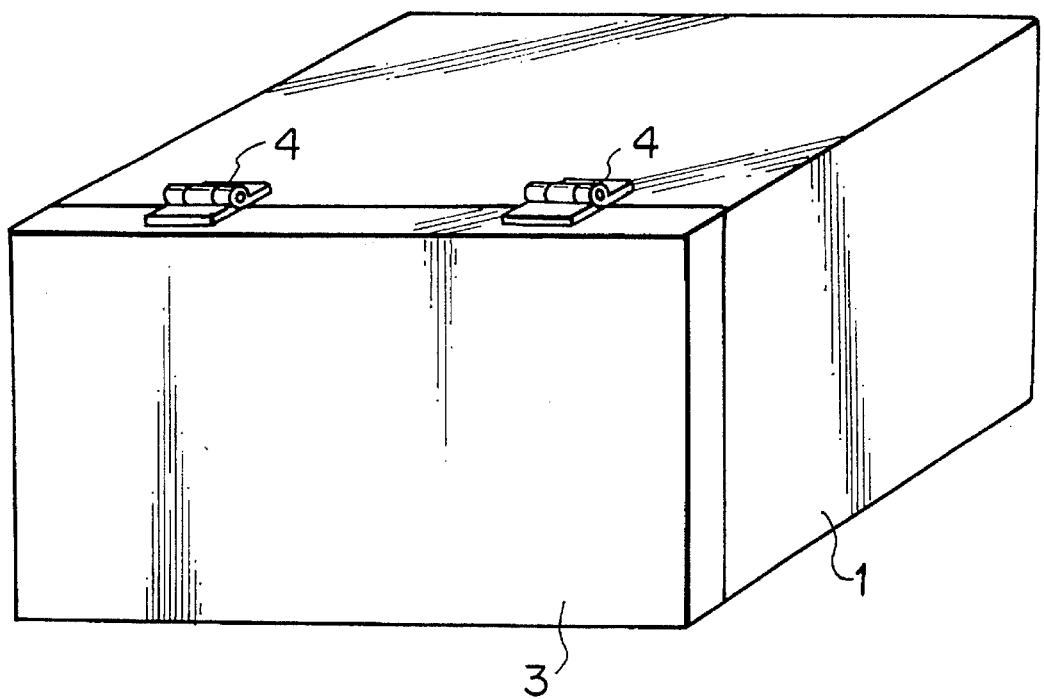
FIG. 1 is a front-side perspective view of a first embodiment of the case for electromagnetic shielding according to the present invention as viewed askance from above.
Figure 2:
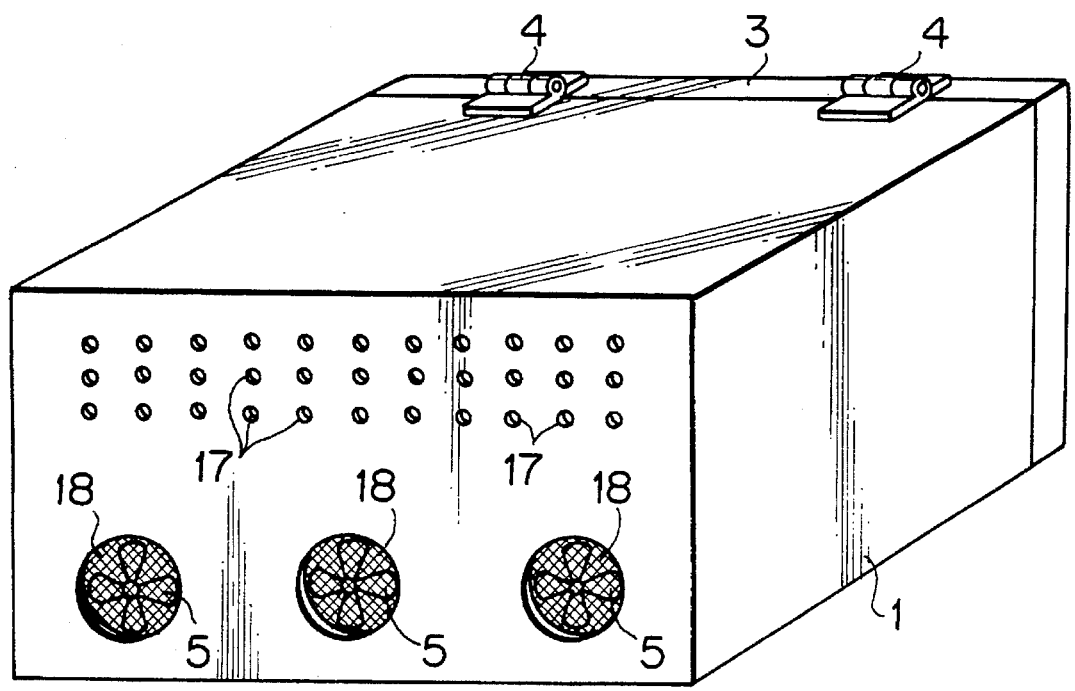
FIG. 2 is a rear-side perspective view of the case of FIG. 1 as viewed askance from above.

As shown in FIGS. 2 through 4, a plurality of first cooling air inflow hole 18 is formed through the rear surface of the container body 1, where an air suction fan 5 is mounted. At the lower portion of the container body 1, a first duct 10 is formed, and a plurality of first cooling air outflow holes 11 is formed through the end surface 9 of the aperture of the container body so that they communicate with the air inflow holes 18 through the duct 10. These air outflow holes 11 are each disposed right below the guide rails 2 corresponding to them. The duct 10 is common to all the air outflow holes 11.

A plurality of second cooling air inflow holes 12 are formed on the inner side of the lid body 3 so that when the lid body 3 is closed (that is, it is fitted to the aperture of the container body 1) they come correspondingly adjacent to each of the air outflow holes 11. Further, on the inner side of the lid body 3, three second cooling air outflow holes 14 are formed as disposed upwardly of each of the cooling air inflow holes 12 at equal intervals. As shown, these air outflow holes 14 protrude a little. Internally of the lid body 3, a plurality of second ducts 13 each communicating the air inflow hole 12 and the corresponding air outflow holes 14 are formed.

On the front end surface of the case 20 of the package 23, a plurality of third cooling air inflow holes 15 are formed so as to each fit the corresponding air outflow holes 14 of the closed lid body 3. As shown in FIG. 4, the top ends of the air outflow holes 14 are each inserted into the air inflow hole 15. Further, on the Fear end surface of the case 20, a plurality of third air outflow holes 16 are formed. Within the case 20, the intermediate portion between both side surfaces of the case 20 and both surfaces of the printed wiring board 21 communicates the air inflow hole 15 and the air outflow hole 16.

As shown in FIGS. 2 and 4, a plurality of fourth air outflow holes 17 are formed through the container body 1 communicating with the exterior.

In this embodiment, cooling air compulsorily introduced from the air inflow hole 18 into the duct 10 by means of the fan 5 is compressed within the duct 10 and enters a duct 13 from the air outflow hole 11 through the air inflow hole 12 to be injected into the package 23 from the air outflow hole 14 through the air inflow hole 15. Subsequently, it flows along both surfaces of the printed wiring board 21, during which it exchanges heat with the heat evolving portion of the printed wiring board 21 to flow out from the air outflow hole 16 into the container body 1. From the interior of the container body 1, air flows out through the air outflow holes 17 to the exterior. The foregoing air flow is indicated by arrow in FIG. 4.

According to this embodiment, as described above, since the cooling air can efficiently be supplied to a narrow space within the package 23, the printed circuit board 21 can be cooled efficiently with a small air flow rate. In consequence, the diameter of the inflow hole 15 and the outflow hole 16 of the case 20 of the package 23 can be made sufficiently small, and an excellent performance of electromagnetic shielding can be achieved. In particular, in this embodiment, the electronic circuit member is the planar printed wiring board 21, and the case 20 is formed flat, the air inflow hole 15 and the air outflow hole 16 are provided only on its end surface without providing holes at all on the side surface of the case 20, which allows an extremely excellent shielding effect of the printed wiring board 21 to be achieved.

Further, according to this embodiment, since an excellent heat dissipating effect can be achieved even with a small flow rate of cooling air, noise caused by the fan 18, which is the driving source for communicating the cooling air, can be reduced. Still further, this embodiment allows circuit connection between the connector portion 22 and the receptacle 7 as well as accommodation of the package 23 in position within the container body 1 providing excellent handing properties.

Figure 7:
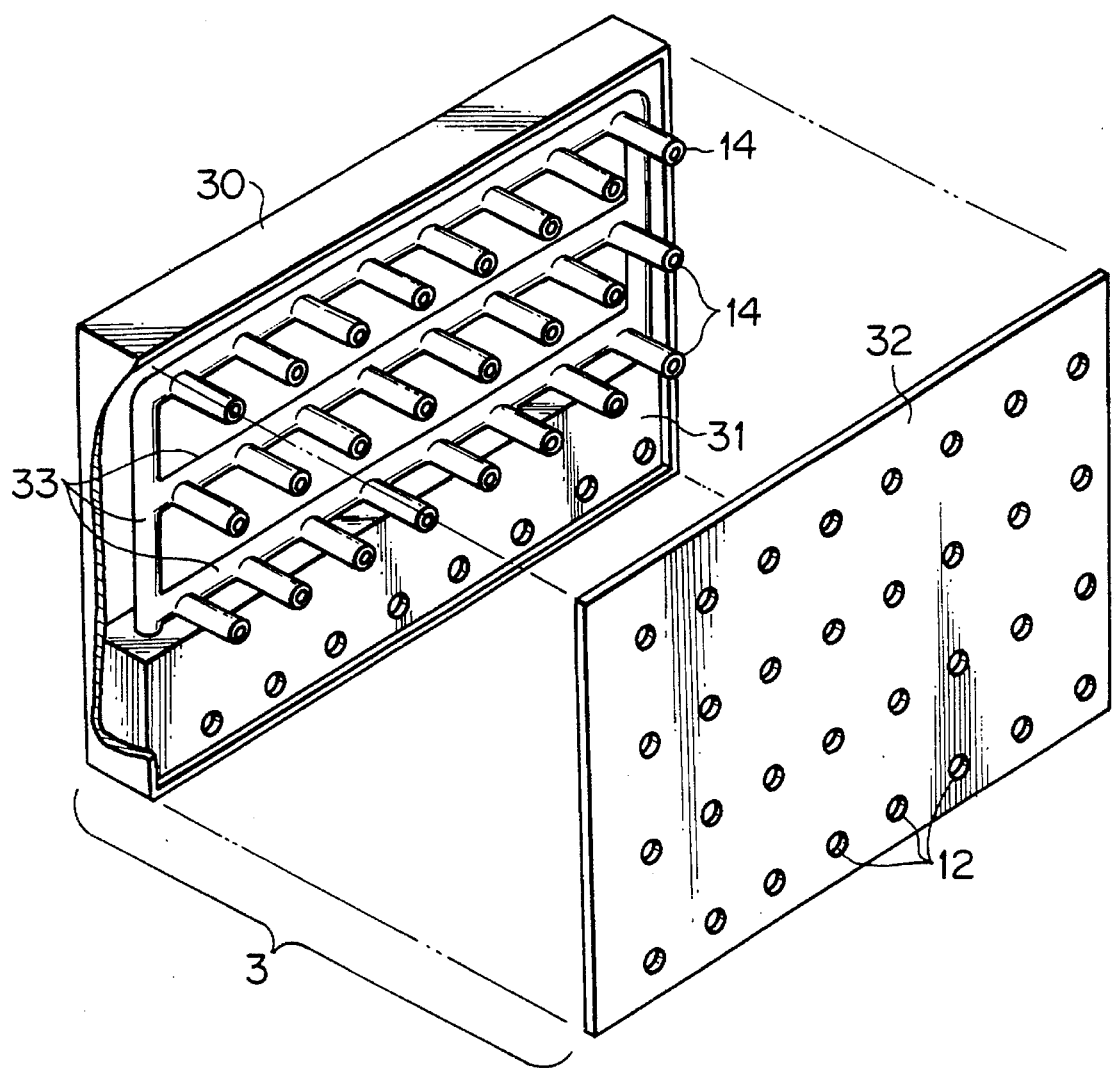
FIG. 7 is a partially cutaway and exploded perspective view illustrating a modified embodiment of the lid body.

FIG. 7 illustrates a modified embodiment of the lid body 3 according to the foregoing embodiment, in which like signs are assigned to the members having like functions as in FIGS. 1 through 6.

In this modified embodiment, lid body 3 is constituted with joined members 30 and 32, the member 30 being provided with a single common duct 31 communicating with a plurality of air inflow holes 12, and a branched duct 33 is formed so as to communicate the common duct 31 and each air outflow hole 14.

Thus, the cooling air flowing in from the air inflow holes 12 may be temporarily reserved within the common duct 31 so that it may be injected from the air outflow holes 14 after its air pressure is boosted.

Figure 8:
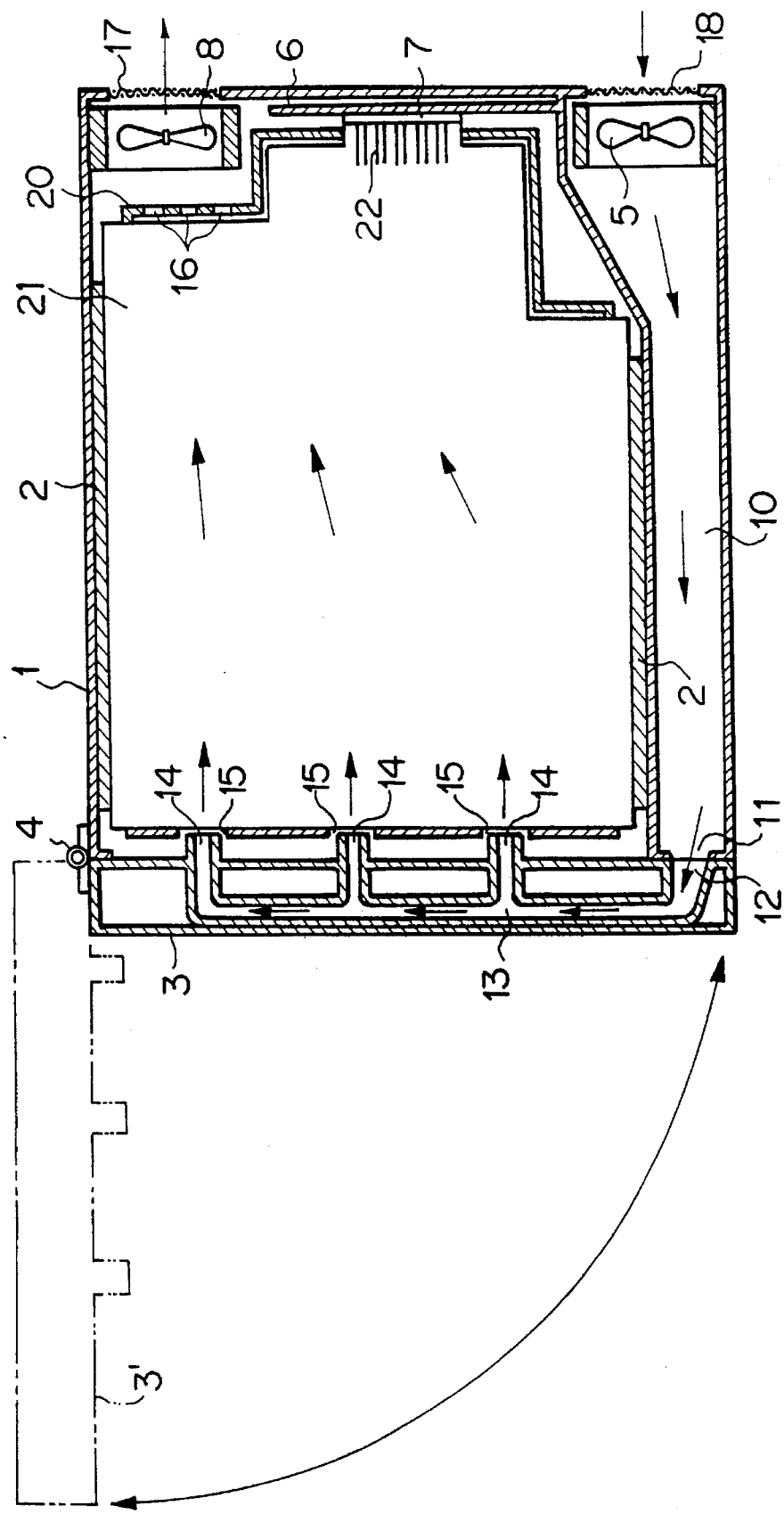
FIG. 8 is a longitudinal cross-sectional view of a second embodiment of the case according to the present invention.
Figure 9:
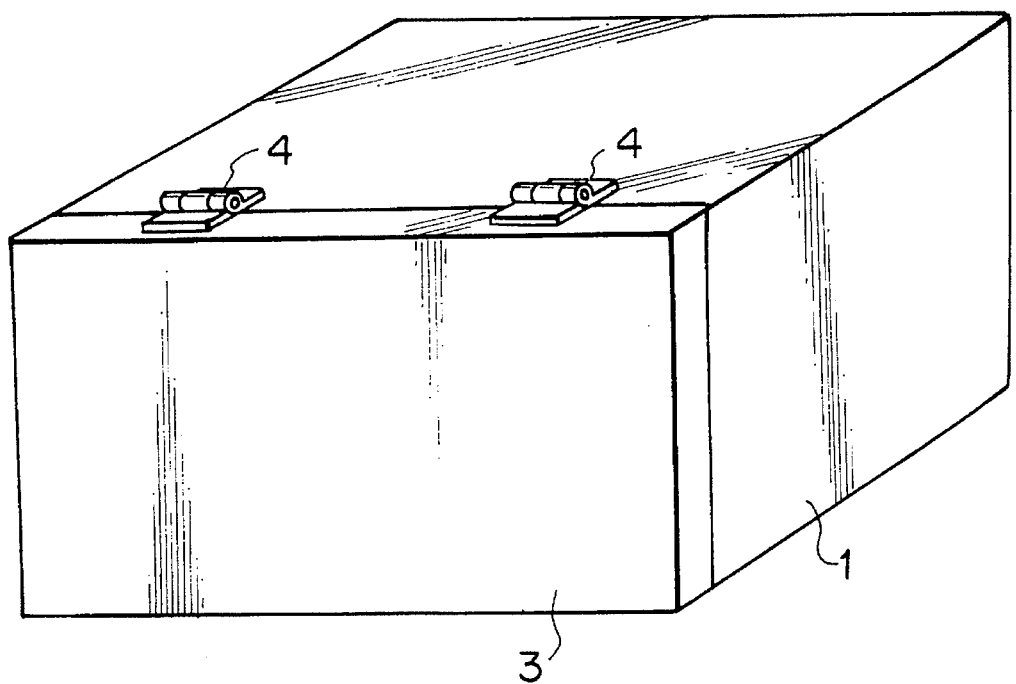
FIG. 9 is a front-side perspective view of another embodiment of the case for electromagnetic shielding according to the present invention as viewed askance from above.
Figure 10:
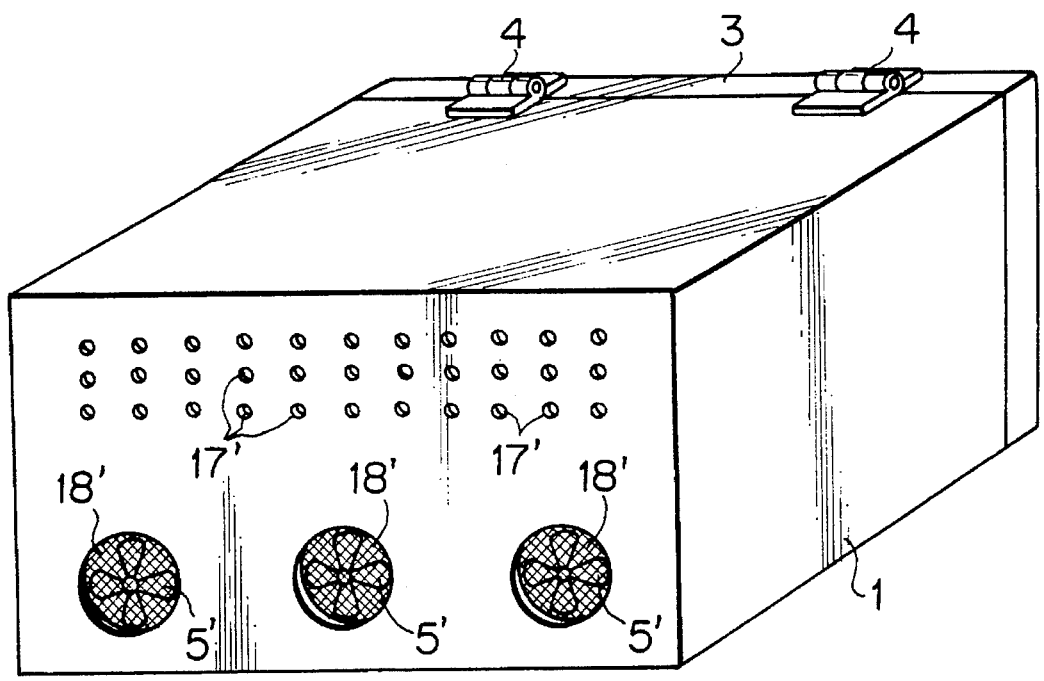
FIG. 10 is a rear-side perspective view of the case of FIG. 9 as viewed askance from above.
Figure 12:
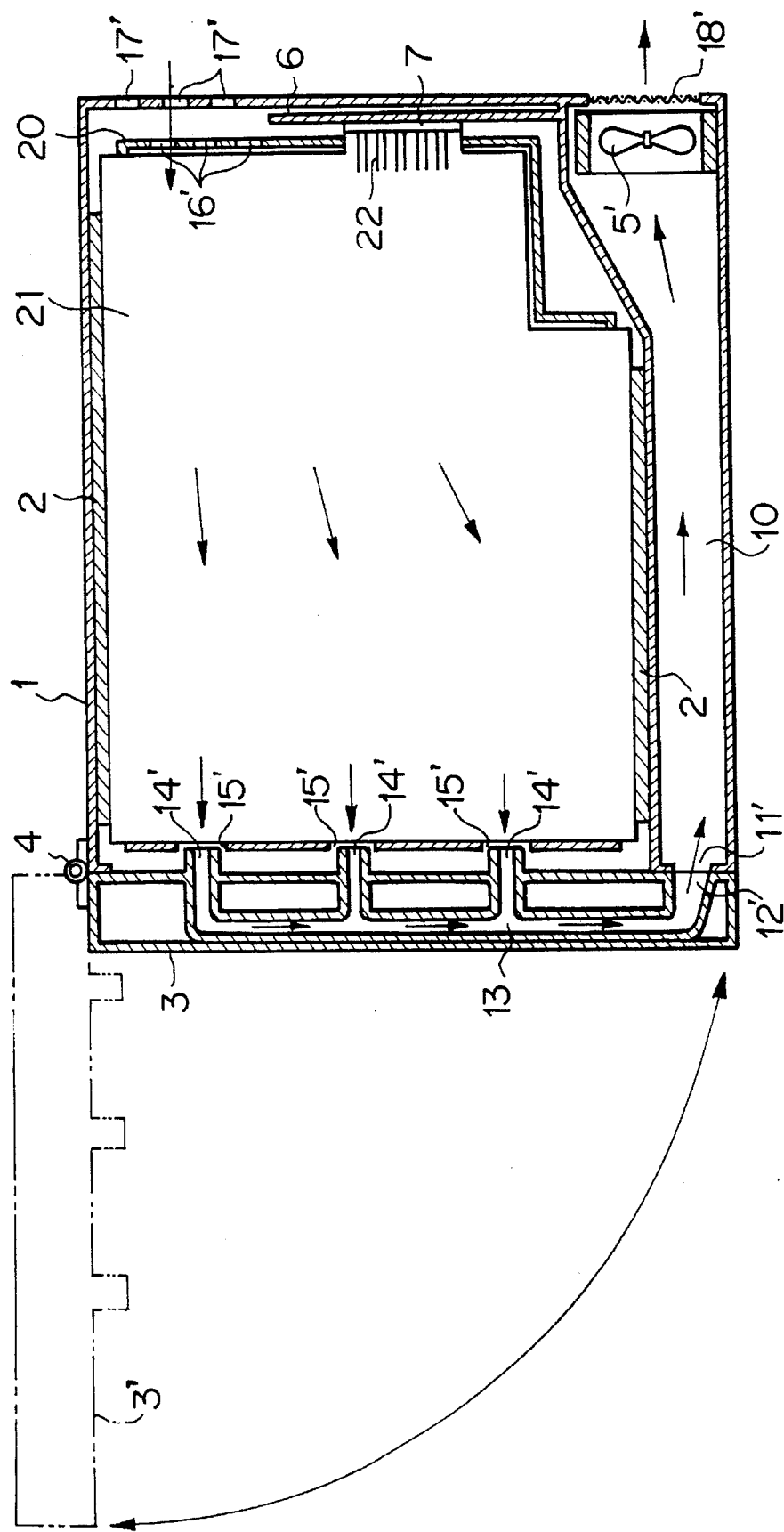
FIG. 12 is a longitudinal cross-sectional view of the case of FIG. 9.
Figure 13:
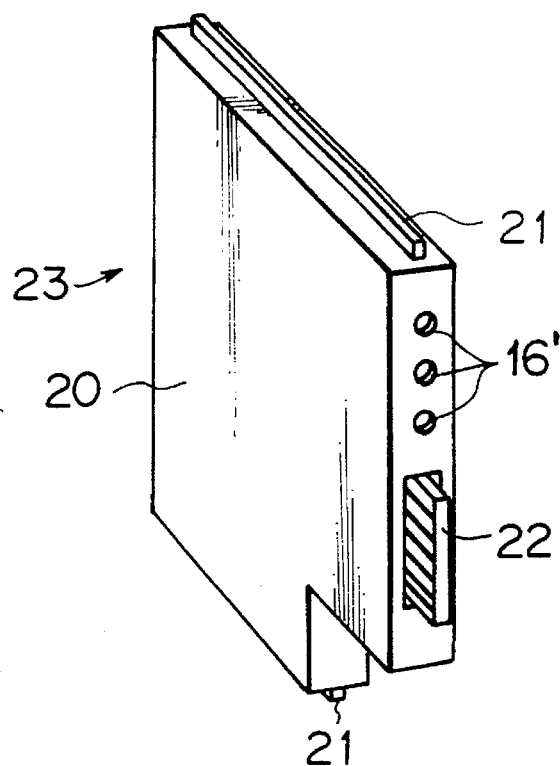
FIG. 13 is a rear-side perspective view of an electronic circuit package as viewed askance from above.
Figure 14:
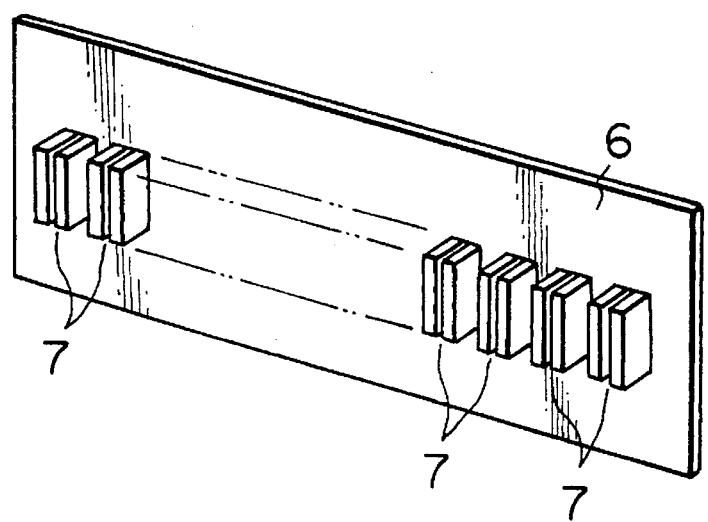
FIG. 14 is a front-side perspective view of a back plane as viewed askance from above.
Figure 15:
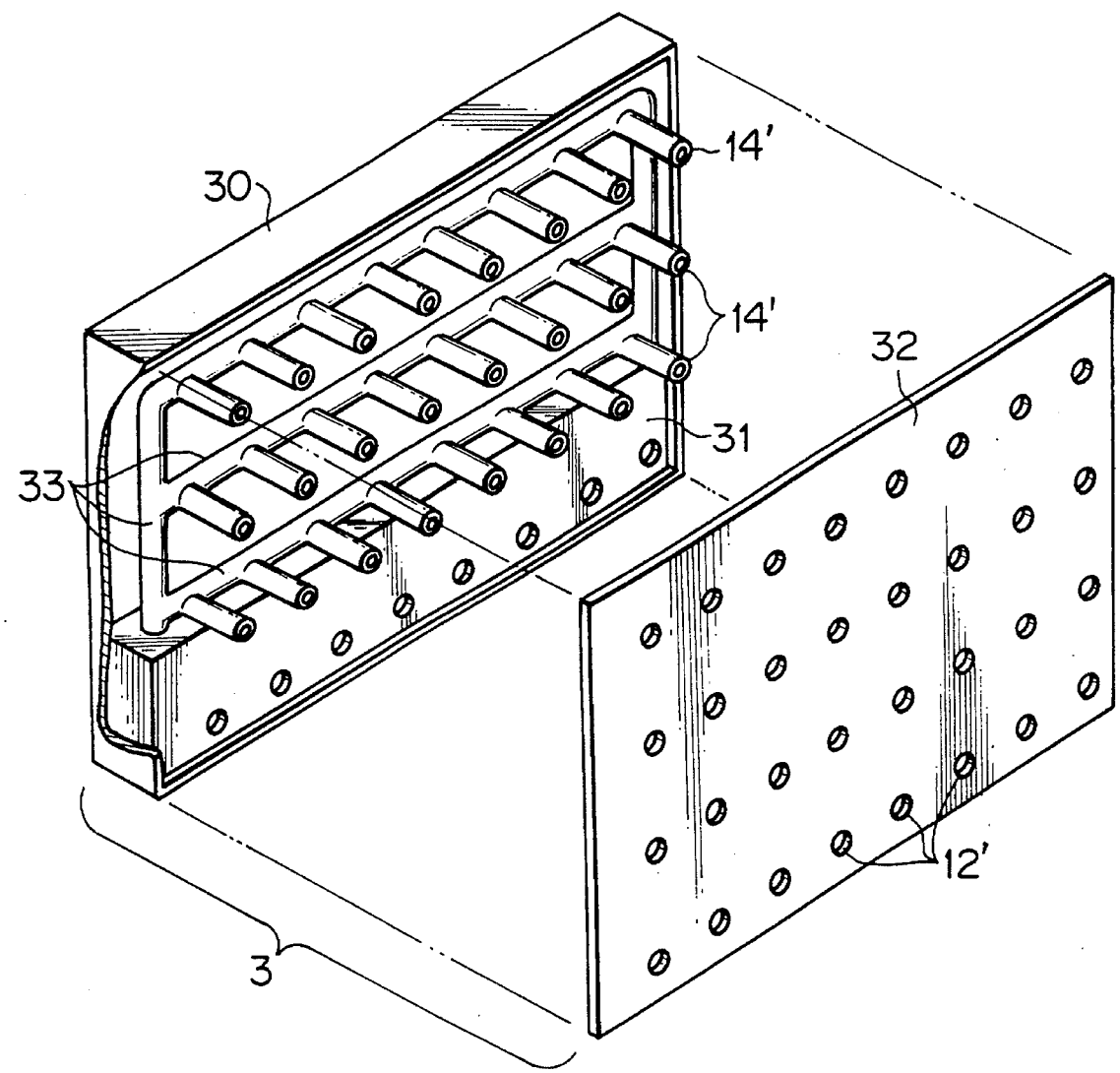
FIG. 15 is a partially cutaway and exploded perspective view illustrating another modified embodiment of the lid body.

FIG. 8 illustrates a second embodiment of the present invention. This figure illustrates a portion corresponding to FIG. 4. In FIG. 8, like signs are assigned to the members having like functions as in FIGS. 1 through 7.

This embodiment only differs from the first embodiment in that an evacuating fan 8 is mounted to the air outflow hole 17. According to this second embodiment, by actuating both of the air suction fan 5 and the evacuating fan 8, the pressure profile over the entire air communicating path can be made even to achieve a further efficient cooling effect.

In the above embodiments, the first to third air inflow holes may be used as the first to third air outflow holes respectively and the first to fourth air outflow holes may be used as the first to fourth air inflow holes respectively. In such a case, the direction of air flow is reversed, and the air suction fan and the evacuating fan are exchanged each other.

In FIGS. 9–16, 18' denotes a first air outflow hole, 5' denotes an evacuating fan, 11' denotes a first air inflow hole, 12' denotes a second air outflow hole, 14' denotes a second air inflow hole, 15' denotes a third air outflow hole, 16' denotes a third air inflow hole, 17' denotes a fourth air inflow hole, and 8' denotes a suction fan.

The present invention should not be understood to be confined to the foregoing embodiments, but it should be understood to include all possible embodiments following the technical ideas represented by the description of the claims which follow.

What is claimed is:

1. A case for shielding electronic circuit members from electromagnetic waves, comprising:

at least one electronic circuit package (23) accommodating an electronic circuit member (21) within an electrically conductive case (20), said electrically conductive case shields said electronic circuit member from said electromagnetic waves;

a container body (1) having an aperture for letting in and out said at least one electronic circuit package (23) therethrough and a space for accommodating said at least one electronic circuit package; and a lid body (3) adapted to fit to said aperture of the container body;

said at least one electronic circuit package (23) having a connector portion (22) carrying terminals of said electronic circuit member (21), said container body (1) having a receptacle (7) connected to said connector portion (22) of said at least one electronic circuit package (23) which is accommodated within said space;

said container body (1) forming therethrough a first air inflow hole (18) communicating with an environment outside said container body, a first air outflow hole (11) formed at a portion abutting on said lid body fitted to said container body (1) and a first duct (10) for communicating said first air inflow hole (18) with said first air outflow hole (11);

said lid body forming therethrough a second air inflow hole (12) disposed at a position corresponding to said first air outflow hole (11) of the container body (1) fitted to said lid body (3), a second air outflow hole (14) formed at a portion opposed to said at least one electronic circuit package which is accommodated within said space of the container body (1) and a second duct (13) for communicating said second air inflow hole with said second air outflow hole (14);

said electrically conductive case of the at least one electronic circuit package forming therethrough a third air inflow hole (15) disposed at a portion corresponding to said second air outflow hole (14) of said lid body (3) fitted to said container body (1) and a third air outflow hole (16); and further said container body (1) forming therethrough a fourth air outflow hole (17) communicating with the environment outside said container body.

2. A case for shielding electronic circuit members from electromagnetic waves as set forth in claim 1, wherein a first fan (5) for sucking air from the environment outside said container body to said first duct (10) is attached to said first air inflow hole (18).

3. A case for shielding electronic circuit members from electromagnetic waves as set forth in claim 1, wherein a second fan (8) for evacuating air from the container body to the environment outside said container body is attached to said fourth air outflow hole (17).

4. A case for shielding electronic circuit members from electromagnetic waves as set forth in claim 1, wherein a retainer member (2) for retaining said electronic circuit package is provided on said container body.

5. A case for shielding electronic circuit members from electromagnetic waves as set forth in claim 4, wherein said retainer member (2) also serves as a guide to move said at least one electronic circuit package (23) relative to said container body (1) and an engaging portion (21) fitted to said retainer member (2) is formed on said electronic circuit package.

6. A case for shielding electronic circuit members from electromagnetic waves as set forth in claim 1, wherein said lid body (3) is openably and closably mounted to said container body (1) by means of a hinge (4).

7. A case for shielding electronic circuit members from electromagnetic waves as set forth in claim 1, wherein said electronic circuit member (21) is planar in dimension.

8. A case for shielding electronic circuit members from electromagnetic waves as set forth in claim 7, wherein said electronic circuit member (21) is a printed circuit board.

9. A case for shielding electronic circuit members from electromagnetic waves as set forth in claim 5, wherein said electronic circuit member (21) is planar in dimension and said engaging portion of said at least one electronic circuit package (23) is an edge portion of said electronic circuit member which protrudes from the electrically conductive case (20).

10. A case for shielding electronic circuit members from electromagnetic waves as set forth in claim 7, wherein said electrically conductive case (20) of said at least one electronic circuit package (23) has two flat side plates disposed at an interval relative to each surface of said electronic circuit member (21).

11. A case for shielding electronic circuit members from electromagnetic waves as set forth in claim 10, wherein said case comprises a plurality of electronic circuit packages, said plurality of said electronic circuit packages being disposed in a substantially parallel relationship within the container body, said third air inflow hole (15) being formed through an end surface of each of said plurality of electronic circuit packages.

12. A case for shielding electronic circuit members from electromagnetic waves as set forth in claim 11, wherein a plurality of third air inflow holes (15) are formed through each of said plurality of electronic circuit packages (23), said plurality of third air inflow holes being disposed at substantially equal intervals.

13. A case for shielding electronic circuit members from electromagnetic waves as set forth in claim 11, wherein said first duct (10) is a first common channel to supply air to each of said plurality of electronic circuit packages.

14. A case for shielding electronic circuit members from electromagnetic waves as set forth in claim 11, wherein a portion of said second duct (13) at the side of said second air inflow hole (12) is a second common channel to supply air to each of said plurality of electronic circuit packages (23).

15. A case for shielding electronic circuit members from electromagnetic waves, comprising:

at least one electronic circuit package (23) accommodating an electronic circuit member (21) within an electrically conductive case (20), said electrically conductive case shields said electronic circuit member from said electromagnetic waves;

a container body (1) having an aperture for letting in and out said at least one electronic circuit package (23) therethrough and a space for accommodating said at least one electronic circuit package (23); and a lid body (3) adapted to fit to said aperture of the container body (1);

said at least one electronic circuit package (23) having a connector portion (22) carrying terminals of said electronic circuit member (21), said container body (1) having a receptacle (7) connected to said connector portion (22) of said at least one electronic circuit package (23) which is accommodated within said space;

said container body (1) forming therethrough a first air outflow hole communicating with an environment outside said container body, a first air inflow hole (11') formed at a portion abutting on said lid body (3) fitted to said container body (1) and a first duct (10) for communicating said first air outflow hole with said first air inflow hole (11);

said lid body (1) forming therethrough a second air outflow hole (12') disposed at a position corresponding to said first air inflow hole (11') of the container body (1) fitted to said lid body (3), a second air inflow hole (14') formed at a portion opposed to said at least one electronic circuit package (23) which is accommodated within said space of the container body (1) and a second duct (13) for communicating said second air outflow hole (12') with said second air inflow hole (14');

said electrically conductive case of the at least one electronic circuit package (23) forming therethrough a third air outflow hole (15') disposed at a portion corresponding to said second air inflow hole (14') of said lid body (3) fitted to said container body (1) and a third air inflow hole (16'); and further said container body (1) forming therethrough a fourth air inflow hole (17') communicating with the environment outside said container body.

16. A case for shielding electronic circuit members from electromagnetic waves, comprising:

(a) a container body (1);

(b) an electrically conductive case (20) for shielding said electronic circuit members from said electromagnetic waves, containing at least one electronic circuit member (21), said electrically conductive case (20) being disposed within said container body (1) and having a connector portion (22) for connecting to an electrical connecting portion (7) provided at said container body (1);

(c) at least one first cooling air hole (15) formed at a front portion of said electrically conductive case;

(d) a front cover (3) supported at a front portion of said container body (1);

(e) a second cooling air hole (14) formed at an internal surface of said front cover (3) to communicate with said first cooling air hole (15) of the electrically conductive case;

(f) a first duct (13) formed within said front cover so as to communicate with said second cooling air hole thereof;

(g) a third cooling air hole (11) formed through said container body (1) so as to communicate with said first duct (13) of said front cover (3);

(h) a second duct (10) formed within said container body (1) so as to communicate with said third cooling air hole thereof.

17. A case for shielding electronic circuit members from electromagnetic waves as set forth in claim 16, wherein said front cover (3) is provided with said first duct for internally interconnecting a plurality of cooling air holes formed internal thereto.

18. A case for shielding electronic circuit members from electromagnetic waves as set forth in claim 16, further comprising a suction fan (5) and an evacuating fan (8) or a suction/evacuating fan.

19. A case for shielding electronic circuit members from electromagnetic waves as set forth in claim 18, wherein said suction fan (5) is adapted to suck air from an environment outside said container body to said second duct (10) of said container body (1).

20. A case for shielding electronic circuit members from electromagnetic waves as set forth in claim 18, wherein said evacuating fan (8) is adapted to evacuate air from said container body (1) to an environment outside said container body.

* * * * *